United States Patent [19]
DeGree

[11] Patent Number: 5,463,530
[45] Date of Patent: Oct. 31, 1995

[54] DUAL SIDED LAMINATED SEMICONDUCTOR MOUNTING

[75] Inventor: David C. DeGree, Burnsville, Minn.

[73] Assignee: The Bergquist Company, Minneapolis, Minn.

[21] Appl. No.: 203,709

[22] Filed: Feb. 28, 1994

Related U.S. Application Data

[63] Continuation of Ser. No. 14,475, Feb. 5, 1993, abandoned.

[51] Int. Cl.⁶ .................................................. H05K 7/20
[52] U.S. Cl. .................. 361/707; 165/80.2; 165/80.3; 165/185; 174/16.3; 174/252; 361/720
[58] Field of Search ................... 165/80.2, 80.3, 165/185; 174/16.3, 252, 255, 256, 258, 260; 361/704, 707, 711, 712, 720, 721, 761, 767, 770–771

[56] References Cited

U.S. PATENT DOCUMENTS

| | | | |
|---|---|---|---|
| 3,120,350 | 2/1964 | Muenz | 174/260 |
| 4,551,787 | 11/1985 | Mittal et al. | 361/387 |
| 4,574,879 | 3/1986 | Degree et al. | 165/185 |
| 4,810,563 | 3/1989 | DeGree et al. | |
| 5,045,642 | 9/1991 | Ohta et al. | 174/255 |

FOREIGN PATENT DOCUMENTS 0028831  1/1989  Japan ..................................... 174/252

Primary Examiner—Gregory D. Thompson
Attorney, Agent, or Firm—Haugen and Nikolai

[57] ABSTRACT

An apparatus for carrying semiconductor mounting devices in back-to-back arrangement is disclosed in which a central substantially planar thermally conductive support member is provided with recesses in its top and bottom surfaces of an interlocking congruent shape with the semiconductor devices to be received such that each semiconductor mounting device assembled therein is positively positioned and locked in place and fixed in a manner such that the semiconductor elements mounted on the layered or laminar elements connect directly to circuitry carried on the surfaces of the support member.

20 Claims, 2 Drawing Sheets

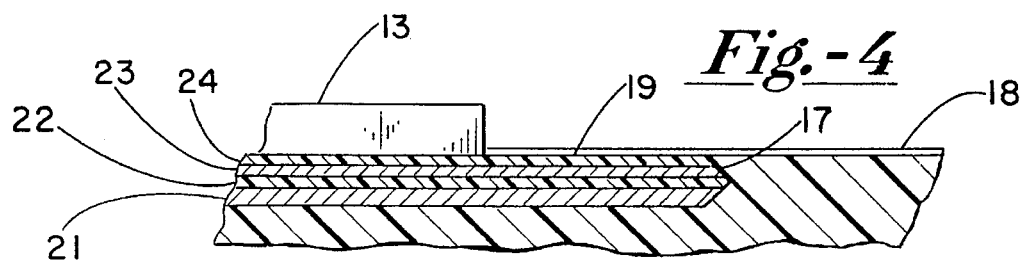
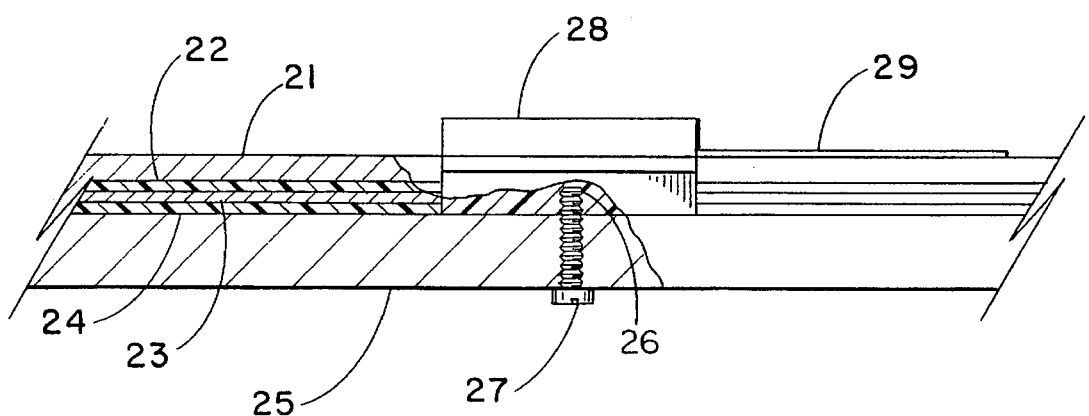

DUAL SIDED LAMINATED SEMICONDUCTOR MOUNTING

This is a continuation of application Ser. No. 08/014,475, filed on Feb. 5, 1993, now abandoned.

BACKGROUND OF THE INVENTION

1. Field of the Invention

The present invention relates generally to thermally conductive, electrically insulative multi-layer laminae for mounting printed circuits and the surface mounting of semiconductor devices connecting to such circuits. More particularly, the invention relates to heat dissipation in a recessed dual-sided, back-to-back mounting arrangement adapted for use with a thermally conductive support board or mounting base to increase circuit density without increasing chassis size. The mounting system may be further provided with shaped recesses adapted to receive multi-layer semiconductor mounting laminae of matching pattern for insertion in a lock-in type mode to the thermally conductive support board or mounting base in precise relation to surface circuits.

2. Description of the Related Art

A solid-state electronic device is normally mounted on a support member which, in turn, is received in the chassis of the larger apparatus to which it pertains. The support member is thermally conductive, but electrically insulating, to the chassis. The electronic devices operatively mount on the surface of the support member and are electrically coupled to printed circuitry, and other devices. These include surface mounted resisters and/or leadless chip carriers having one or more chip assemblies which may be received on the surface of the circuit-bearing layer. It is also known to provide a multi-layer laminate incorporating a metallic base or substrate circuit carrying layer with one or more distinct electrically insulative and thermally conductive layers being disposed therebeneath and one or more conductive metal or heat spreader layers frequently being interposed beneath or between the insulative layers. The printed circuit carrying layer or surface mounting layer for semiconductor devices is the outer surface of the base member or circuit board device.

Heat generated by electrical devices in circuit arrangements has long been a limiting factor in the ability of designers to reduce the size of the circuits in complicated electrical or electronic devices because of heat dissipation limitations. Therefore, increased heat dissipation has long been a desirable goal in the development of such circuitry. Accordingly, each development which allows such devices to dissipate heat more efficiently, as by overcoming thermal impedance in electrically insulating materials without reducing the electrical insulating properties of that material, for example, is highly desirable.

One such arrangement is illustrated and described in U.S. Pat. No. 4,810,563 issued Mar. 7, 1989, entitled "Thermally Conductive, Electrically Insulative Laminate". That application is assigned to the same assignee of the present invention. That invention represents a distinct improvement in the state-of-the-art ability of mounting devices to dissipate heat generated by the electrical circuit elements including any semiconductor devices mounted thereon. The use of the circuit mounting techniques and arrangements described in the reference show excellent heat dissipation for single layer circuit arrangements. However, such arrangements limit the number of layers of circuitry which can be mounted in a given volume of chassis space. The increased sophistication and miniaturization of devices has made it highly desirable that all the available space be utilized to the degree that heat dissipation allows. Thus, dual sided arrangements would enhance this situation a great deal.

In addition to maximizing heat dissipation, the simplification of assembly with respect to positioning and mounting laminated elements in the support or base member and making the necessary connections has long been sought by circuit manufacturers. Ease of placing and connecting recessed laminar elements in situ is a prominent factor associated with both reduced cost and increased reliability of finished parts.

SUMMARY OF THE INVENTION

In accordance with the present invention, recessed back-to-back mounting can be achieved with respect to multi-layered, electrically insulative, thermally dissipating systems in a manner which substantially increases the available circuit packing density without adverse effects on the operation of the circuits. The present arrangement contemplates a pair of printed circuits or other surface mounting arrangements for laminated semiconductor carrying mounting devices, in turn, mounted in juxtaposed back-to-back relation with respect to a single central carrier support member or board. Assembly can be accomplished in a manner which allows quick insertion of laminated mounting elements into precisely/congruent designed recesses and in situ connection made based on a precise matching configuration between part and support recess. The entire assembly is normally mounted with others in stacked arrangement within the chassis of the overall device to which the circuit pertains. The chassis forms the ultimate support and heat sink for dissipation of the excess heat generated inside the apparatus.

In accordance with the preferred embodiment of the present invention, recessed back-to-back mounting of laminated mounting elements is accomplished using a single central support. The laminates contain one or more thermally conductive, electrically insulated layers separating a heat spreader layer from a circuit mounting or electric semiconductor device carrying outer layer. The electrically insulative support member or board is tough and durable, and has good electrical and mechanical properties. It may also be filled with heat conductive particulate solid materials so as to further increase its conductive properties if desired. These layers also possess the capability of withstanding exposure to high temperature excursions of moderate or extended duration during subsequent processing or operation.

The parts are preferably keyed or notched in a three dimensional dovetailing arrangement which promotes precise part placement for element orientation and binds itself to an easy "snap fit" assembly which locks each laminated element in place. The laminate mounting structure can undergo heating for electrical connecting or heat treatment or finishing operations needed to complete curing after assembly.

The structure of each electrically conductive laminated mounting element includes at least three layers of lamina securely bonded together. They include an inner metallic heat spreading layer, a thermally conductive, electrically insulating intermediate layer and an electrically conductive outer layer being disposed to carry the desired circuit device or devices.

Each insulative intermediate layer between the heat spreader layer and the outer electrically conductive layer is normally of a thin imperforate material which may be loaded with particulate solids to increase thermal conductivity. It is a desirable characteristic that such films have a high dielectric constant and also be able to stand high processing temperatures. One such film that has found widespread successful use for such applications is made of polyimide-(amide) film, it being highly possible that other films may be employed and found useful. For example, in certain applications, films of epoxy resin may be utilized in lieu of or in addition to the polyimide(amide) films. Of course, the number and thickness of the intermediate layers will depend on the particular application involved and is entirely within the discretion of those skilled in the art.

It has been found, however, that the use of multiple thin layers of the insulative materials enhances the electrical performance of the composite system in relation to the use of a single layer having the same total thickness. As stated above, the polyimide(amide) film layers are normally filled with a quantity of a thermally conductive, electrically insulative particulate solid material to enhance heat dissipation. Useable materials typically include such things as aluminum oxide (alumina), boron nitride, silica, beryllium oxide, magnesium oxide, titanium dioxide, aluminum nitride, silicon carbide, zinc oxide, diamond, silicon nitride and mixtures thereof.

An amount of thermally conductive electrically insulating solids in an amount from about 20% to 200% by weight of polyimide(amide) solids and adhesive solids respectively is normally used and the polyimide(amide) film preferably has a nominal thickness of about one-quarter mil to 5 mils. Of course, these parameters can be varied as required or desired. The outer layer of the assembly, i.e., the circuitry layers, are preferably copper, however, solder, copper or aluminum-clad copper may be satisfactorily used, the copper may be applied in any desirable manner from sheets to in situ deposition.

The heat spreader layers vary in thickness and typically function to spread the heat generated, possibly from point sources, by the electronic or other circuit elements over more area to reduce "hot spots". These are highly thermally conductive metallic layers, normally aluminum or copper, and are used to enhance the transfer of heat to the dissipating base or support members. The outer or circuit mounting layer typically includes a sheet of at least one layer of a thermally conductive metal selected from the group consisting of copper, aluminum, steel, Alloy 42, Invar, Kovar and molybdenum and laminates thereof. The base substrate normally has a cross-sectional thickness in excess of about 15 mils.

The recessing of the laminar structure into the support member provides better heat dissipation and also further decreases the thickness of the total structure. This arrangement also decreases the vulnerability of the system to external damage.

Of course, additional insulating and heat spreading layers can be provided as desired and considerations such as the coefficients of thermal expansion of the system and substrate material may be of design interest. An alternate embodiment uses a thermal clad or T-clad layer which is mounted through an opening in the multi-layer board. The T-clad member is fastened directly to a metallic heat sink. The semiconductor device is mounted on a metallic (copper) layer on the thermal clad member.

BRIEF DESCRIPTION OF THE DRAWING

FIG. 4 is an enlarged partial (vertical) or broken sectional view taken showing a greater detail of the dovetailed construction in accordance with one embodiment of the invention; and FIG. 5 depicts a vertical sectional view with a portion cut away of an alternative mounting structure for a semiconductor device.

DESCRIPTION OF THE ILLUSTRATIVE EMBODIMENT

Figure 1:
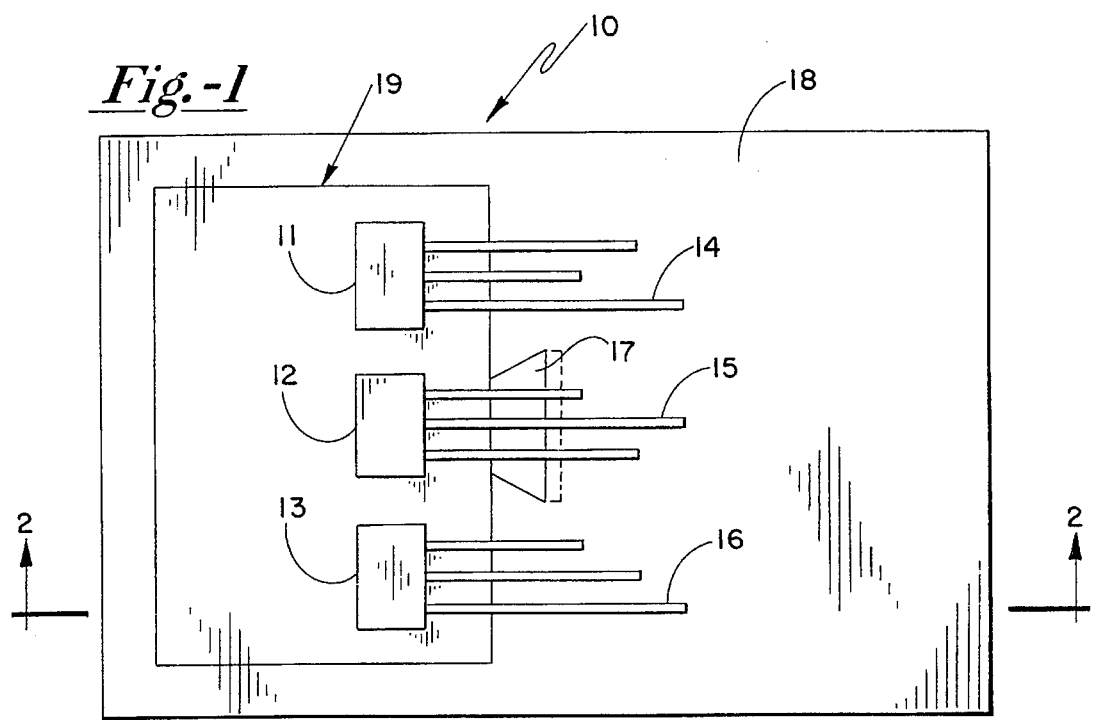
FIG. 1 is a plan view showing typical semiconductor or other circuit devices mounted on one surface of a support member and having a dovetailed tab.

In accordance with one embodiment of the present invention, dual laminated elements or mounting structures may be embedded in opposite sides of a circuit board or other structural thermally conductive support member. Typically, such a device, is assembled and then embedded in the circuit board or thermally conductive support member. The assembled device or circuit board, generally designated by 10 in FIG. 1, is utilized with others as a semiconductor or solid-state circuit mounting member for attachment to a chassis (not shown) which also acts as a heat sink. Each circuit typically includes one or more semiconductor or solid-state electrical devices 11, 12 and 13. These devices are generally semiconductor electrical current translating devices such as silicone wafer devices mounted on the assembly and having conductive leads or lines extending to the appropriate connection zones or points as illustrated by 14, 15 and 16 in FIG. 1. An outline of a typical recess mounted laminar structure is depicted by 19 and includes a dovetailed tab section.

Such semiconductor assemblies are commercially available in large quantities in various shapes and sizes for a great variety of applications and uses mounted on thin ceramic bases or metallic bases in a well-known manner; and the arrangement in FIG. 1 merely illustrates one possibility. The electrical and thermal properties of the device of the present invention also enable it to be used as a mounting surface for semiconductor chip devices or the like wherein the back surface of the chip is bonded directly to conductors or a conductor array.

Figure 2:
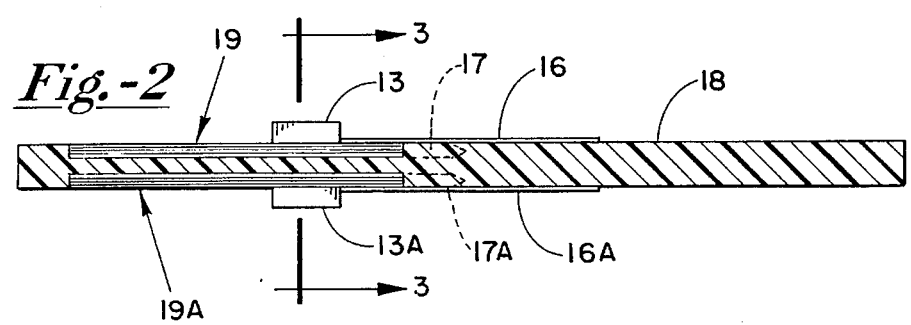
FIG. 2 is a vertical sectional view taken through a portion of FIG. 1 at 2—2 and showing imbedded laminar structures together with circuit devices mounted on top and bottom sides of the support member.
Figure 3:
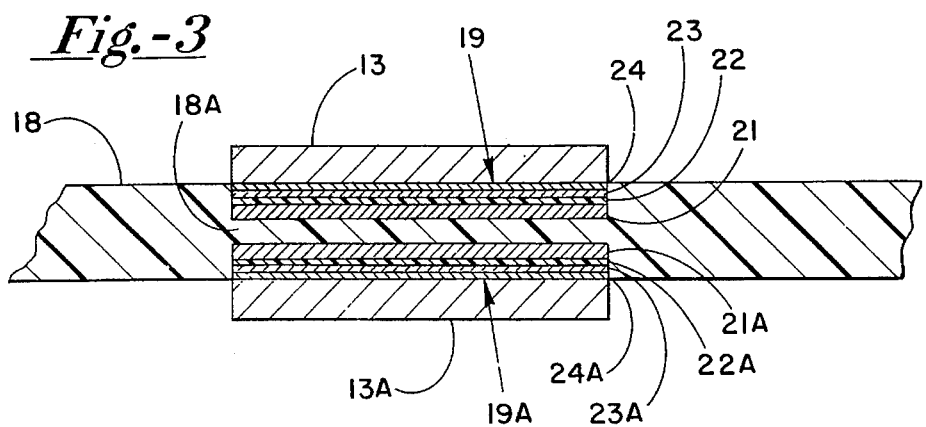
FIG. 3 is an enlarged broken vertical sectional view illustrating a fragmentary portion of a typical cross-section taken along 3—3 of FIG. 2, showing greater detail of individual laminar layers in accordance with one embodiment of the invention.

As further illustrated in FIGS. 2–4, the laminated mounting structure can be partially or totally recessed into the structural board or support member 18 recessed at 18A, numbers 13A and 16A representing back-to-back replicas of parts 13 and 16. This is desirable to increase heat dissipation through the support member to the chassis. It also serves to lower the profile and decrease the vulnerability of the system to damage. The illustration of the dual mounting mode shows identical top and bottom laminates for illustrative purposes. Of course, the number and types of layers in each laminate may be varied with respect to a particular application and may be varied even within those attached to the same particular support member 18. The basic laminate includes outer metallic layers 24 and 24A for supporting the electrical or electronic devices inner non-metallic electrically insulating but thermally conducting layers 22 and 23 or 22A and 23A and heat spreading metallic, highly thermally conducting layers 21 and 21A.

The insulative layers 22 and 23 or 22A and 23A are typically polyimide(amide) layers laced with thermally conductive, electrically insulative particulate solids to enhance heat dissipation without affecting electrical insulative properties. The member 18 further is designed to dissipate heat from the heat spreader members 21 and 21A to the mounting chassis and to convection cooling, if appropriate, in a manner commensurate with the desired circuit packing density of the device in which it is mounted. One or more of the layers 22 and 23 or 22A and 23A may also be of an epoxy resin or a thermally conductive epoxy adhesive material, it being further understood that each of the metallic and polyimide(amide) layers are laminated by an intermediate adhesive layer such as an epoxy or other thermally conducting, high temperature tolerant material as required for the use and processing of the particular device involved.

Mounting of the solid-state electrical device as at 11 with connecting circuitry as at 15 is normally such that the appropriate connections are made when the laminar structure is inserted into the member 18. The self-aligning inserts may be simply snapped into place in the board 18 as at 18A. Heat processing may also be used to secure such connections. Additional details with respect to the various layers of laminae can be found in the above-referenced patent and to the extent necessary for the completion of this specification such details may be deemed incorporated by reference in this specification.

By embedding the laminated element within the structure of the board of support member 18, additional heat dissipation is realized through the member 18 and generally more compact, less vulnerable construction is achieved. It is, of course, further contemplated that whatever structure be used in the laminate that it will be fully able to withstand the processing temperatures or operating temperatures of the underlying device. The dual top/bottom mounting in accordance with the invention enables twice as many electronic devices to be mounted with respect to the area of support members provided thereby reducing the mounting required for the device in which it is used.

In addition, if desired, thermal conductivity of the member 18 can also be enhanced in the manner of the layers 22 and 23 by the addition of a quantity of particulate solid heat conducting material to the internal structure of that member. Accordingly, it has been found that materials such as aluminum oxide, boron nitride, or mixtures thereof may also be useful for this purpose. This can be done, for the most part, without affecting the structural integrity of the member 18 which is also an important consideration.

With respect to the dovetailed construction of the preferred embodiment, it will be appreciated that any recessed shape which allows easy placement of the circuit assembly within the support member and provides precise positive positioning and locking of the circuit assembly in the support member can be used. This may provide for a "snap fit" type construction which makes assembly easy. Connection and permanent securing of the assembly in the support member can readily be accomplished by heating in situ.

Not only does the snap-fit technique of the invention reduce assembly labor with regard to making connections, it also allows parts to be coded with regard to size and shape of the dovetails or keys 17 and 17A so that correct assembly of structure supporting a plurality of such devices is made easier much in the manner of a jigsaw puzzle. This add reliability to assembly so that the correct laminated mounting element is associated with the correct position in the support member.

The use of specifically shaped inserts with congruent support recesses also allows the recesses to be further tailored to increase heat dissipation in relation to each insert if desired. Thus, additional heat dissipating layers of metal elements can be inserted or deposited in the recesses in the support member, for example.

An alternative embodiment for mounting a semiconductor component or device is illustrated by FIG. 5. A semiconductor component 28, having at lead 29 is filled into a recess or hold provided in the mounting board using a thermal-clad (T-clad) or metal coated higher temperature polymer material thermally conducting mount which, in turn, is fixed directly to a heat sink 25 as by one or more screws 27 through a thermally conductive, electrically insulating metal clad layer shown with the metal cladding broken away at 26. This direct coupling to the heat sink while not back-to-back, also allows a higher component packing density to be achieved by providing better heat dissipation. The semiconductor component may be conveniently soldered to the thermal clad mount which normally has an upper layer of copper. It should be noted that the thermal clad mounting can be used in conjunction with other mounting techniques in the same board.

This invention has been described in this application in considerable detail in order to comply with the Patent Statutes and to provide those skilled in the art with the information needed to apply the novel principles and to construct and use such specialized components as are required. However, it is to be further understood that the invention can be carried out by specifically different equipment and devices and that various modifications, both as to equipment details and operating procedures, can be accomplished without departing from the scope of the invention itself.

What is claimed is:

1. A heat-dissipating structure for fixably carrying laminated electronic device mounting structures in back-to-back arrangement comprising:

(a) a substantially flat thermally conductive central support member defining a pair of substantially parallel oppositely disposed spaced surfaces;

(b) wherein said central support member contains one or more recesses arranged in each of said oppositely disposed surfaces in generally back-to-back relation, each of said one or more recesses having a surface and being configured to accommodate an electronic device mounting structure of matching shape in a keyed mating, locking relation, the device mounting structure locking in situ in a predetermined position upon insertion in one of said recesses; and (c) said central support member further including conductive printed circuitry on at least one surface thereof arranged to abut with matching circuitry on a device mounting structure when locked in situ in one of said recesses.

2. The apparatus of claim 1 further comprising at least one device mounting structure in one of said one or more recesses.

3. The apparatus of claim 2 wherein each said at least one device mounting structure is a laminated structure further comprising:

(a) a metallic heat spreading layer comprising a highly thermally conductive metal selected from the group consisting of aluminum and copper, said heat spreading layer disposed to contact said central support member in an assembled configuration;

(b) a mounting layer having an upper surface carrying one or more electrical devices and a lower surface, said mounting layer comprising a thermally conductive metal selected from the group consisting of copper, aluminum, steel, Alloy 42, Invar, Kovar and molybdenum and laminae thereof;

(c) at least one electrically insulative film layer of imperforate polymer film selected from the group consisting of polyamide and polyamide films interposed between said heat spreading layer and the lower surface of said mounting layer;

(d) wherein the upper surface of said mounting layer further carries electrically conductive circuitry arranged to abut with said printed circuitry of said central support member;

(e) a substantially continuous, void-free adhesive film bonding adjacent layers of said device mounting structure together and to said central support member.

4. The apparatus of claim 3 wherein the at least one electrically insulative film layer further contains thermally conductive electrically insulative particulate solids therein.

5. The apparatus of claim 4 wherein said particulate solids are selected from the group consisting of aluminum oxide, boron, nitride, silica, beryllium oxide, magnesium oxide, titanium dioxide, aluminum nitrate, silicon carbide, zinc oxide, diamond, silicon nitride, and mixtures thereof.

6. The apparatus of claim 5 wherein the amount of said particulate solids is between 20% and 200% by weight of said imperforate film.

7. The apparatus of claim 1 wherein said central support member further contains an amount of thermally conductive electrically insulative particulate solids therein.

8. The apparatus of claim 7 wherein said particulate solids in said central support member are selected from the group consisting of aluminum oxide, boron nitride, silica, beryllium oxide, magnesium oxide, titanium dioxide, aluminum nitrate, silicon carbide, zinc oxide, diamond, silicon nitride, and mixtures thereof.

9. The apparatus of claim 1 wherein at least one of said one or more recesses has a substantially flat dovetail configuration defining a dovetail plane and wherein the dovetail plane is substantially parallel to the surfaces of said central support member.

10. The apparatus of claim 9 wherein said dovetail is tapered with respect to a plane normal to said dovetail plane.

11. The apparatus of claim 1 wherein at least one of the surfaces of said central support member contains a plurality of recesses.

12. The apparatus of claim 1 wherein both of the surfaces of said central support member contain a plurality of recesses.

13. The apparatus of claim 1 wherein said central member includes said printed circuitry on both sides thereof.

14. The apparatus of claim 11 wherein said central support member includes printed circuitry on both of said pair of oppositely disposed surfaces thereof arranged to connect to matching circuitry on a plurality of device mounting structures received in both sides thereof.

15. An apparatus for mounting oppositely disposed electrical devices in back-to-back arrangement comprising:

(a) a substantially planer heat dissipating, thermally conductive central support member having oppositely disposed top and bottom surfaces including an amount of printed circuitry on the surfaces thereof arranged to abut with matching circuitry on a device mounting structure and wherein the surfaces are provided with a plurality of recesses shaped to accommodate electronic device mounting structures of matching shape therein in a keyed mating, locking relation, the device mounting structure locking in situ in a predetermined aligned position;

(b) a plurality of laminated electronic device mounting structures for semiconductor devices received in recesses in said central support member, each of said laminated mounting structures further comprising;

(1) a metallic heat spreading layer comprising a highly thermally conductive metal selected from the group consisting of aluminum and copper, said heat spreading layer disposed to contact said central support member in an assembled configuration;

(2) a mounting layer having an upper surface carrying one or more electrical devices and a lower surface, said mounting layer comprising a thermally conductive metal selected from the group consisting of copper, aluminum, steel, Alloy 42, Invar, Kovar and molybdenum and laminas thereof;

(3) at least one electrically insulative film layer of imperforate polymer film selected from the group consisting of polyamide and polyamide films interposed between said heat spreading layer and the lower surface of said mounting layer;

(4) wherein the upper surface of said mounting layer further carries electrically conductive printed circuitry arranged to abut with said printed circuitry of said central support member upon mounting;

(5) a substantially continuous, void-free adhesive film bonding adjacent layers of said device mounting structure together and to said central support member;

(6) an amount of a thermally conductive electrically insulative particulate solid material selected from the group consisting of aluminum oxide, boron nitride, silica, beryllium oxide, magnesium oxide, titanium dioxide, aluminum nitrate, silicon carbide, zinc oxide, diamond silicon nitride, and mixtures thereof in each of said insulative film layers and said adhesive.

16. An apparatus for mounting electrical devices with respect to a highly thermally conductive central support heat sink member comprising:

(a) a laminated metal clad mounting structure for carrying electrical devices mounted thereon and having an outer metallic layer;

(b) a substantially planar thermally conductive central support heat sink member having at least one recess of a shape keyed to receive a laminated mounting structure for semiconductor devices of matching shape therein and adapted to be fixedly locked in a predetermined position in a manner wherein the laminated mounting structure abuts said highly thermally conductive central support member;

(c) electrically insulative, thermally conductive metal clad outer layer on said laminated mounting structure; and (d) mechanical fastening means holding said metal clad mounting structure in fixed relation against said heat sink member.

17. The apparatus of claim 16 wherein said outer metallic layer is a metal clad film, said film being selected from the group consisting of polyimide and polyamide films.

18. The apparatus of claim 17 wherein said outer metallic layer contains thermally conductive electrically insulative particulate solids therein.

19. The apparatus of claim 16 wherein said central support member is metal.

20. The apparatus of claim 19 wherein the mechanical fastening means is a metal screw.

* * * * *